United States Patent [19]

Casa et al.

[11] Patent Number: 5,014,164
[45] Date of Patent: May 7, 1991

[54] CABLE ORGANIZER

[75] Inventors: Gene E. Casa, Ruby; Joseph W. Gernon, Kingston, both of N.Y.

[73] Assignee: International Business Machines Corporation, Armonk, N.Y.

[21] Appl. No.: 405,614

[22] Filed: Sep. 8, 1989

[51] Int. Cl.⁵ .............................................. H02B 1/20
[52] U.S. Cl. ...................................... 361/428; 361/391; 361/415
[58] Field of Search .......... 211/41; 361/383, 390–391, 361/415, 427–429; 439/31, 338, 343, 368, 533, 540, 716

[56] References Cited

U.S. PATENT DOCUMENTS

| | | | |
|---|---|---|---|
| 2,459,237 | 1/1949 | Mentor | 179/91 |
| 3,307,080 | 2/1967 | Cody | 317/101 |
| 3,394,287 | 7/1968 | Zitzmann et al. | 317/99 |
| 3,755,630 | 8/1973 | Boyer | 179/98 |
| 3,833,840 | 9/1974 | Sinden | 361/428 |
| 4,062,611 | 12/1977 | Carlsson et al. | 339/17 |
| 4,131,934 | 12/1978 | Becker et al. | 361/428 |
| 4,288,838 | 9/1981 | van Der Vegte et al. | 361/383 |
| 4,307,438 | 12/1981 | Grubb | 361/413 |
| 4,313,039 | 1/1982 | DeLuca et al. | 179/91 |
| 4,470,100 | 9/1984 | Rebaudo et al. | 361/413 |
| 4,510,552 | 4/1985 | Kanno et al. | 361/413 |
| 4,636,725 | 1/1987 | Santomango et al. | 324/158 |
| 4,742,477 | 5/1988 | Phillips et al. | 364/708 |
| 4,748,540 | 5/1988 | Henneberg et al. | 361/415 |
| 4,758,924 | 7/1988 | Dillan et al. | 361/383 |
| 4,759,057 | 7/1988 | DeLuca et al. | 379/327 |

FOREIGN PATENT DOCUMENTS 250796 11/1985 Japan .
897177 6/1960 United Kingdom .
931580 6/1963 United Kingdom .
1423505 2/1976 United Kingdom .

OTHER PUBLICATIONS

IBM Technical Disclosure Bulletin, vol. 20, No. 6, 11/77, pp. 2162 and 2163, "Modularized PC Assembly", Guttridge et al.

IBM Technical Disclosure Bulletin, vol. 13, No. 7, 12/70, pp. 2076 and 2077, "Electronic Page Assembly", Damari.

Primary Examiner—Gregory D. Thompson
Attorney, Agent, or Firm—Robert L. Troike

[57] ABSTRACT

A connector system for a computer assembly is provided where the assembly includes a plurality of self-standing system frames with high density circuitry on support boards slidably mounted to the frames with the connectors facing a common face of the frames. The cabling between frames is provided by a self-standing cabling frame having connectors thereon arranged to correspond to the connectors on the plurality of systems frames and having alignment elements to align and fix the system frames and the cabling frames to provide simultaneous interconnection of the frames.

10 Claims, 8 Drawing Sheets

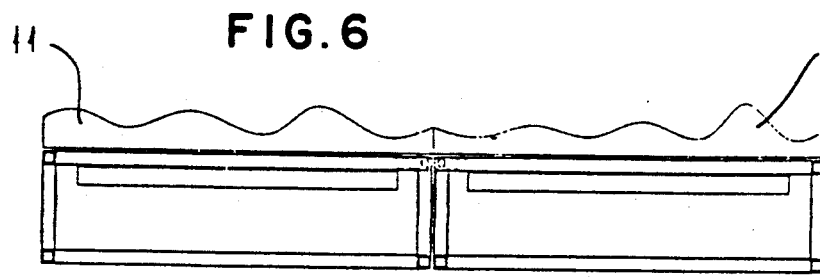
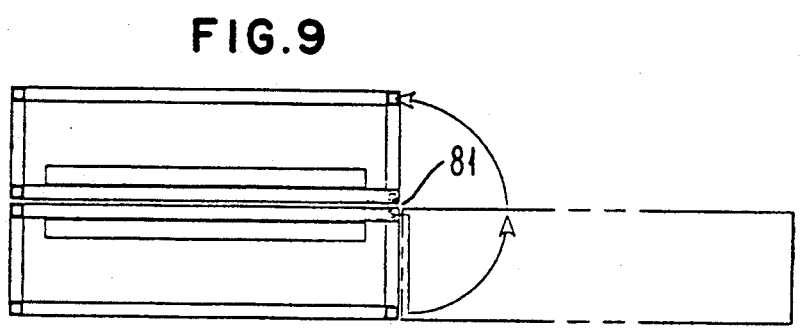
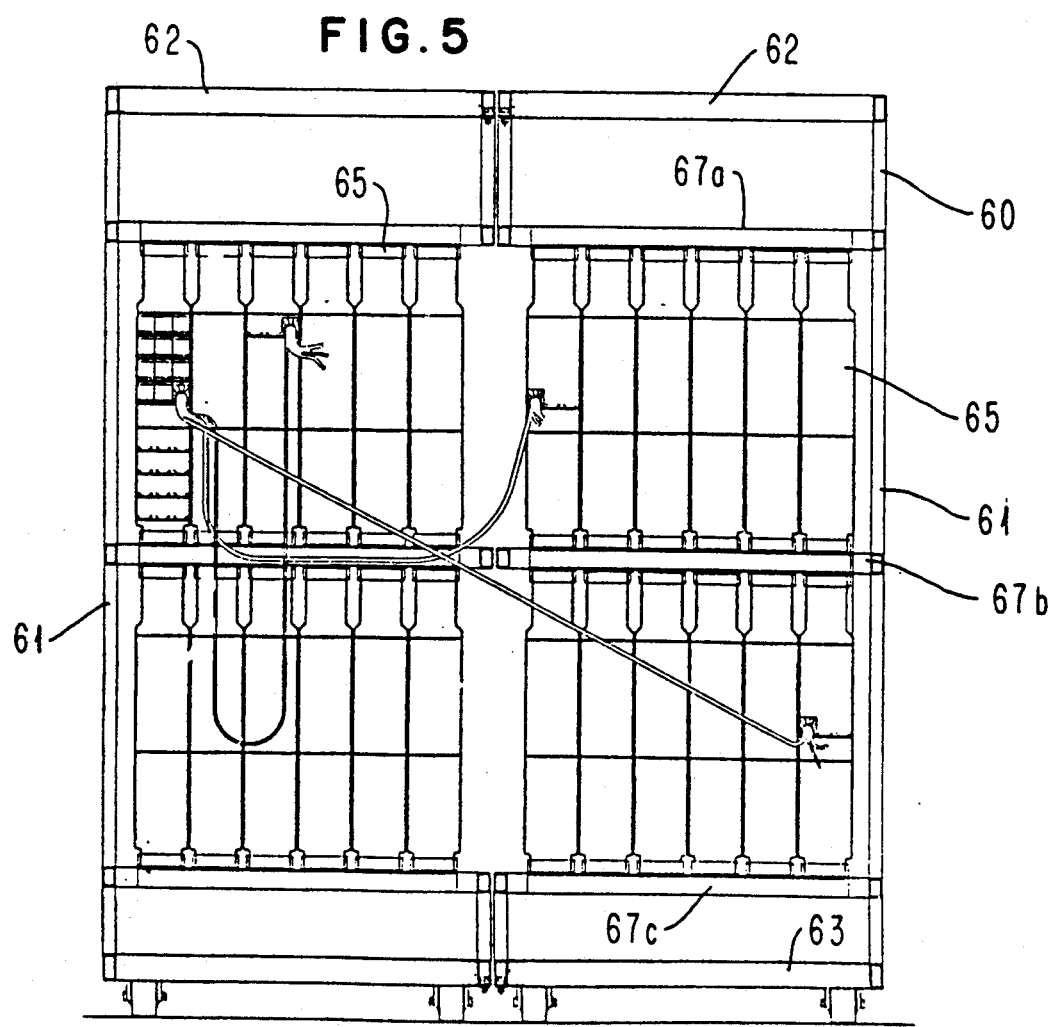

CABLE ORGANIZER

This invention relates to a connector system for a computer and more particularly to a cable organizer for keeping cable groups in their proper position and permitting rapid connection or disconnection of cables for the entire system.

BACKGROUND OF THE INVENTION

It has become impractical, on large systems, to package the entire machine in one frame. This has made it necessary to have a large number of cables interconnecting the frames.

When the system frames are placed on the manufacturing test floor a great deal of time has to be spent cabling the frames together prior to system test. This can tie up valuable manufacturing space for long periods of time. Further once the machine is built and tested in the factory it has to be uncabled, shipped and then reassembled. The time spent recabling the machine at the customer's office is enormously long and prone to error.

This invention is believed to overcome this problem is particularly suitable for a large bookcase style frame complex system as described in co-pending application Ser. No. 07/404,807, filed Sept. 8, 1989, filed concurrently herewith entitled "High Density Circuit Assembly" of the same inventors as the present invention and assigned to the same assignee.

SUMMARY OF THE INVENTION

In accordance with one embodiment of the present invention a connector system for a computer system having plural system frames with multiple connectors facing the same one face of the frames includes a cable frame having cables and connectors fixedly mounted thereto with connectors facing one side thereof The connectors are fixedly mounted to the cables with connectors on the cable frame aligned with appropriate corresponding connectors on the system frames such that when the cable frame is aligned with the system frames the multiple connectors of the system frames are simultaneously connected via the cable frame.

BRIEF DESCRIPTION OF THE DRAWINGS

FIG. 5 is an elevation view of a cable frame according to one embodiment of the present invention.

FIG. 6 is a top view of the cable frame of FIG. 5 mounted to a portion of the system frames of FIG. 1.

FIG. 9 is a top view of the cable frame folded.

DESCRIPTION OF ONE EMBODIMENT OF THE INVENTION

Figure 1:
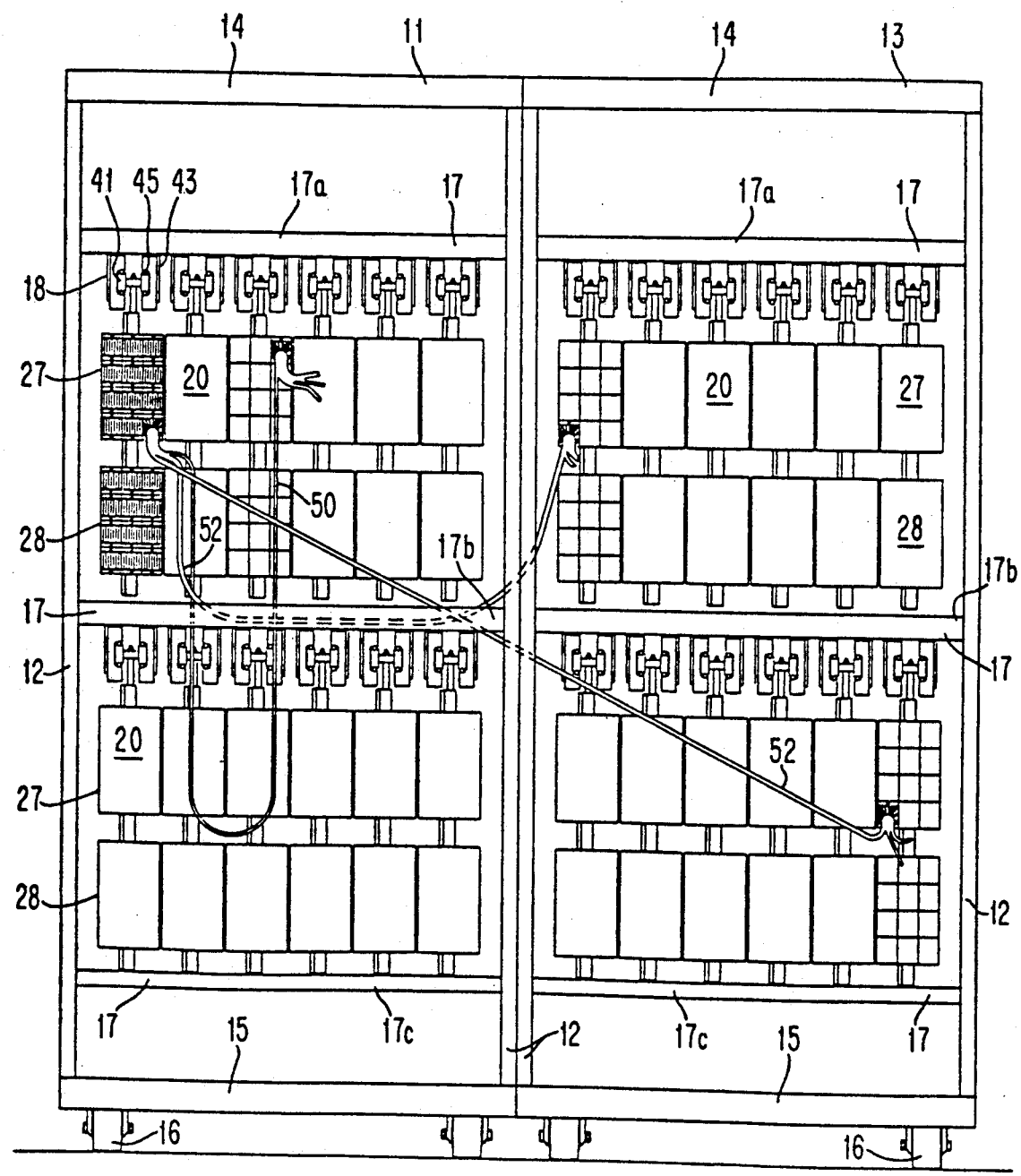
FIG. 1 is an elevation view of a pair of system frames joined according to one embodiment of the present invention.

Referring to FIG. 1 there is illustrated a pair of self-standing system frames 11 and 13 joined side by side. The system frames 11 and 13 each include vertical support members 12 spaced by top members 14 and base members 15 and by shelves 17. Casters 16 may be mounted to the base member 15 to permit the frames to be easily moved. There are, for example, three shelves 17a–17c spaced between the vertical members 12 for each of the frames. Book packages 20 are placed vertically on edge between the shelves as illustrated in FIG. 1. For the embodiment disclosed there are six book packages 20 located between shelf 17a and middle shelf 17b and another six book packages 20 positioned between shelves 17b and 17c. These book packages 20 are slidably mounted to the shelves by slide mechanisms 18 attached to the upper shelves 17a and 17b to permit the book packages to be withdrawn from the frame. Each of these book packages 20 may contain four temperature-controlled modules (TCMs) so that each frame could hold 48 TCMs.

Figure 2:
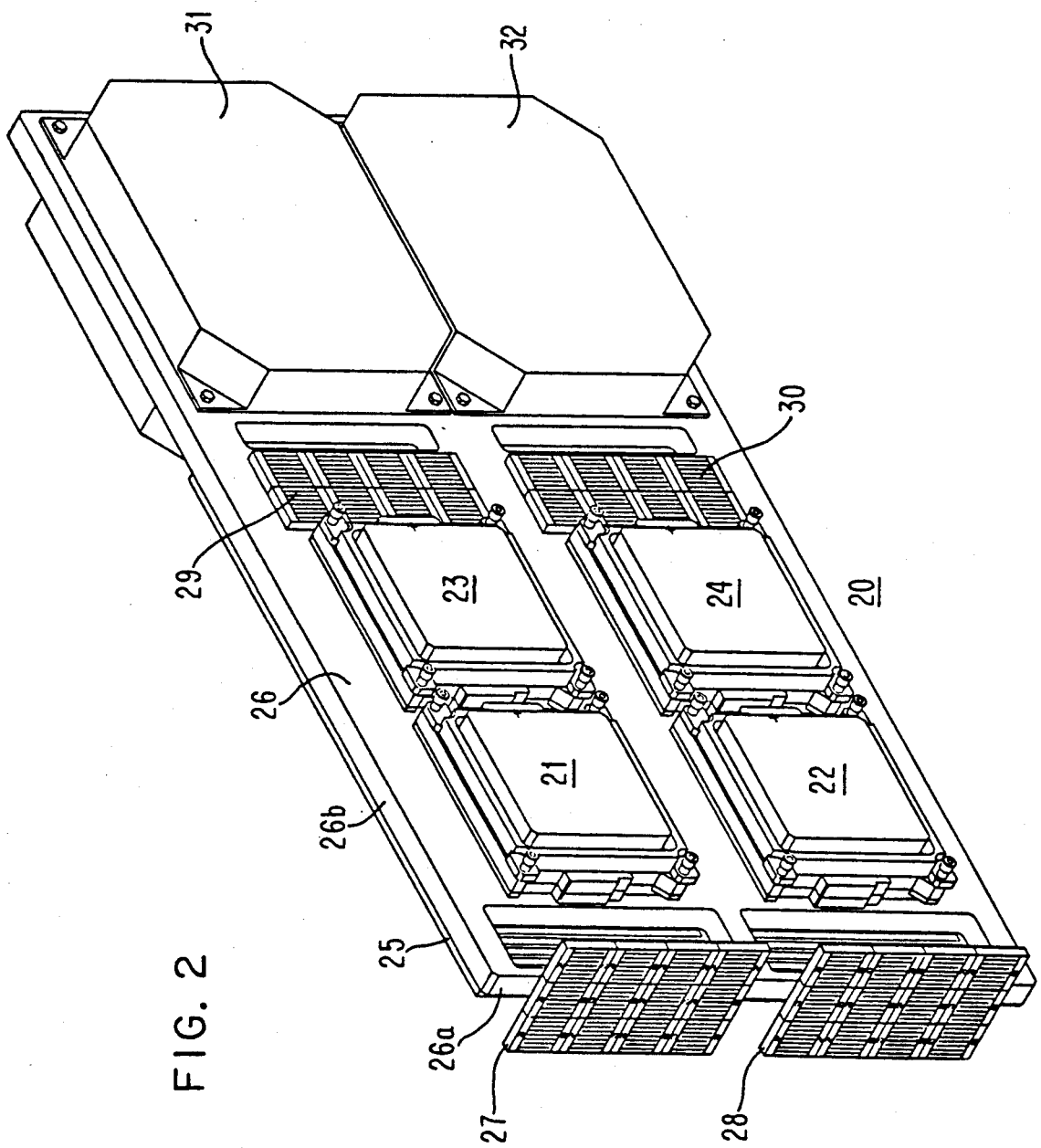
FIG. 2 is a perspective view of a book package as used in FIG. 1.

Referring to FIG. 2 there is illustrated in a perspective view a book package 20 and its components which include a stiffener or support board 26 and four TCMs 21-24, a printed circuit (PC) interconnect board 25, two front facing end connector panels 27 and 28 (each capable of handling 1728 connections), flex circuits 35 (shown in FIG. 3) between the connector panels 27 and 28 and the printed circuit board 25, rear connector modules 29 and 30 (providing two groups of 1152 signal I/O connectors near the rear) and power supplies 31 and 32 for powering the four TCMs mounted to the stiffener or support board 26.

Figure 3:
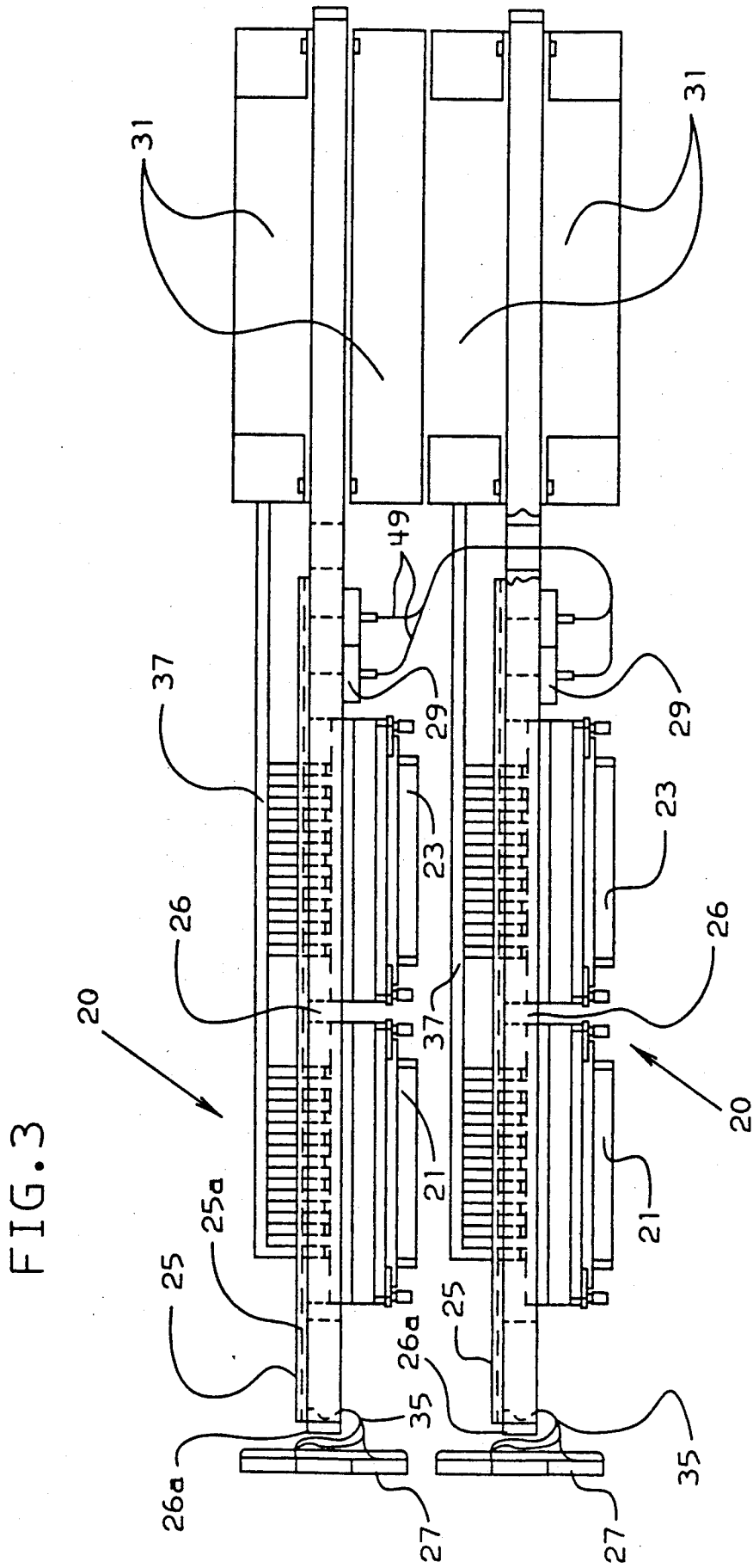
FIG. 3 is a top view of two book packages of FIG. 2.

Referring to the top view in FIG. 3 there is illustrated a pair of book packages side by side. The board 26 has the printed circuit board 25, and TCMs 21 and 23 (TCMs 22 and 24 attached below are blocked from view) attached. The connector panels 27 and 28 are fixed at the one end to board 26 and extend orthogonal to the boards 25 and 26. Extending along the length of the printed circuit board 25 are printed circuit conductors illustrated by dashed lines 25a that couple between the rear connector modules 29 and 30 and the TCM modules 21-24 and between the TCM modules 21-24 and the flex circuits 35 near the end 26a of the board 26. The TCM modules 21-24 and the rear connector modules 29 and 30 extend through apertures in the stiffener board 26 to the PC board 25 for connection, thereto. The modules 21-24 and rear connector modules 29 and 30 are fixed to board 26 via peripheral flanges (not shown) about the TCM module or rear connector module package that do not extend through the aperture. The end 26a of the board 26 and the plane of panels 27 and 28 extend along the front face of the frame for connection to other book packages. The flexible circuits 35 comprise flexible printed circuit conductors on a flexible film to provide the necessary flexible interconnection between the printed circuit board 25 and the connectors on the orthogonallly oriented end connector panels 27 and 28. Power for the TCMs is provided via the power buses 37 located on the opposite side of the TCMs 21-24. Cooling for the TCMs and power supplies is provided via piping not shown. FIG. 3 also shows how closely placed book packages can be connected via cables 49 between the rear connectors 29.

Referring to FIG. 1 there is illustrated how when the books are placed in the frame they are interconnected with cables 50 using the front set of connectors or connector panels. It can be seen that the connector panels at the extreme corners of the frames can be connected with a cable of relatively short length. For a standard size frame 749.3 millimeters wide, 1705 millimeters high and less than 1544 millimeters long, 48 of 127 millimeter TCMs are within a 1250 millimeter size interconnect length. This is extremely important when dealing with high speed computer systems in order to prevent delays and increase the speed of the system.

Figure 4:
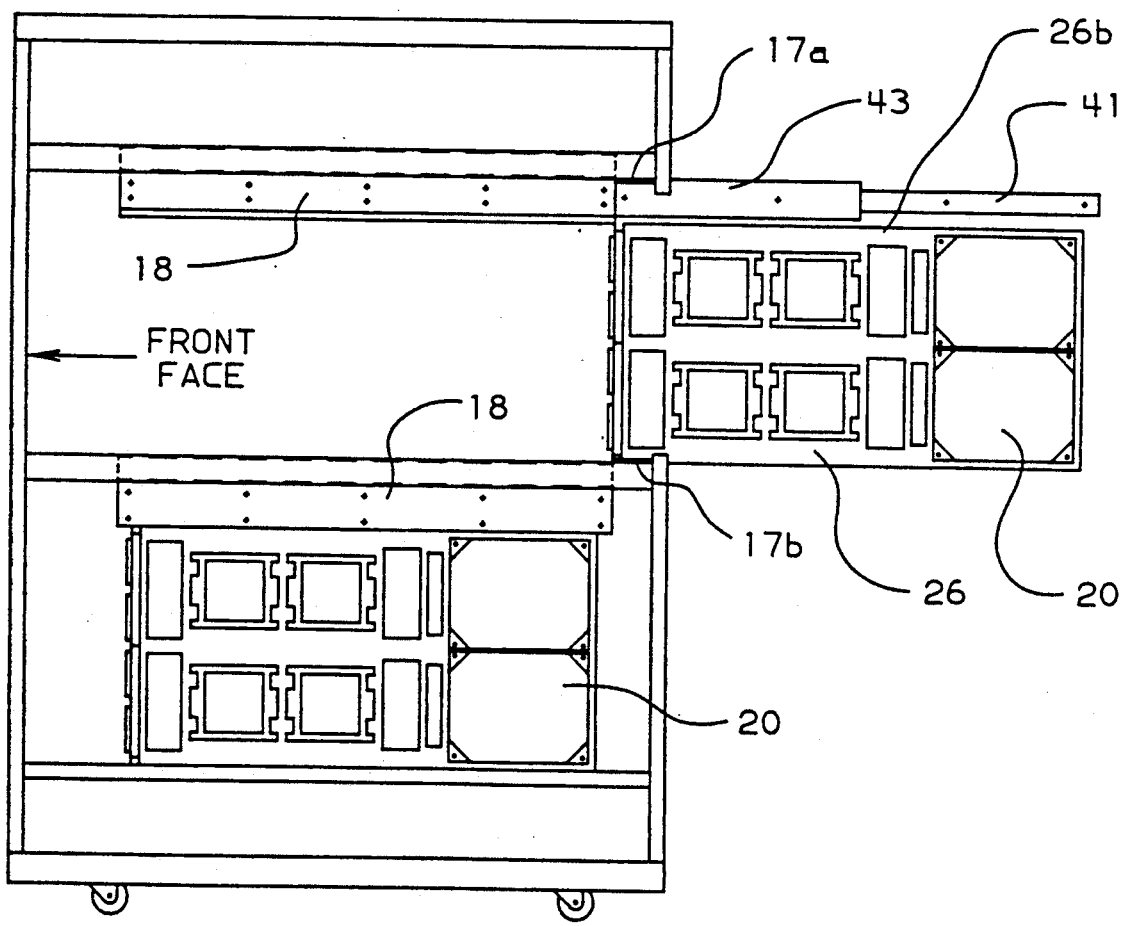
FIG. 4 illustrates how the book packages can be pulled out to the rear on slides.

Referring to FIG. 4 there is demonstrated how the book packages are pulled out from the rear of the slides. This can be accomplished once the cables are unplugged from the books from the front end or connector panel end in large groups to allow the packages to be slid backwards. The top edge 26b of the support board 25 of book package 20 may be mounted to a slide bar 41 which slides along U-shaped channels 43. The slide bar 41 and channels 43 are part of the slide mechanism 18. Bearings 45 such as encapsulated ball bearings can be interposed between the slide bar 41 and the channels 43. The bottom edge could fit in a U-shaped channel (not shown).

Figure 8:
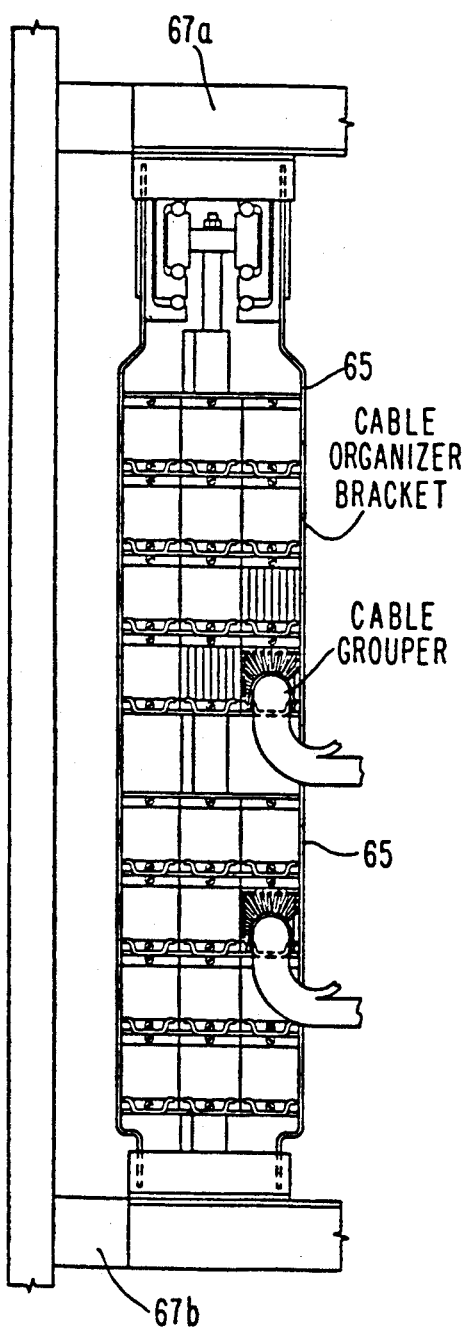
FIG. 8 is a bracket detail A of FIG. 5 of the back side (cabling side) of a cable organizer bracket in the cable frame.
Figure 7:
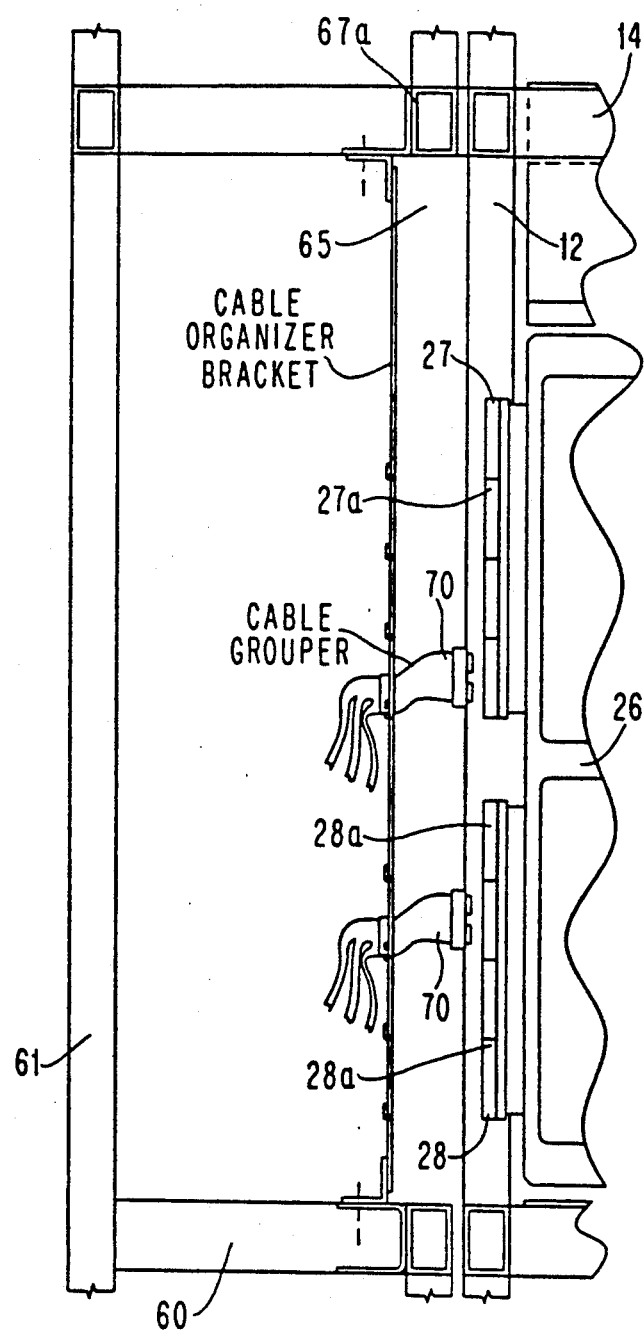
FIG. 7 is a bracket detail A in FIG. 5 illustrating a bracket in a cable frame adjacent a connector panel in the system frame.
Figure 10:
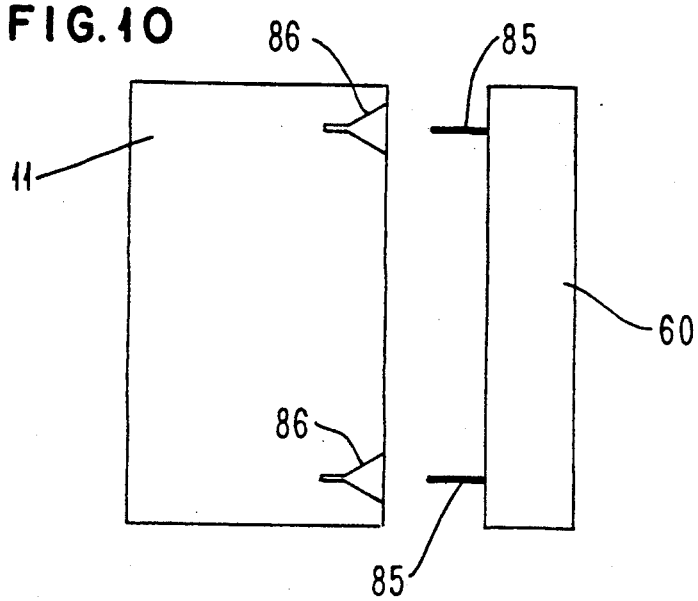
FIG. 10 is a sketch illustrating alignment pins for aligning the cable frame and connection means.
Figure 11:
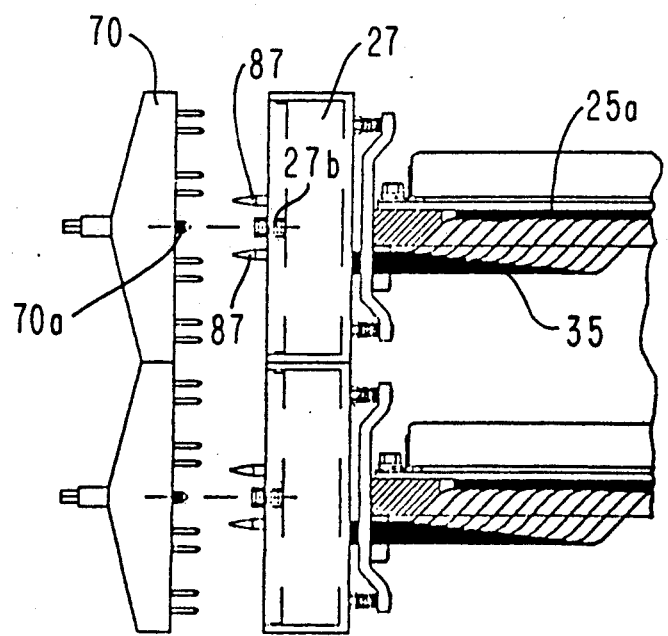
FIG. 11 is a sketch of plug and socket details illustrating alignment and connection means.

Referring to FIG. 5 there is illustrated a self-standing cable organizer frame 60 that accomplishes the cable connection task over both frames 11 and 13. This frame is also on casters as shown in FIG. 5. This cable organizer frame 60 will keep all cable groups in their proper position in front of the book package end connector panels such as 27 and 28 and in addition it will provide cable support and retention required. As shown in FIG. 5 the organizer frame 60 includes a frame 60 which has vertical members 61 and top and bottom members 62 and 63 which are adapted to register with the vertical members 12 and the top and bottom members 14 and 15 of frames 11 and 13. Between top and bottom members 62 and 63 are shelves 67a, 67b and 67c with six cable organizer brackets 65 between shelves 67a and 67b and six more between 67b and 67c. The brackets 65 match up with the end connector panels 27 and 28 of the book packages 20 of FIG. 1. When the cable organizer frame 60 is connected to the system frames 11 and 13 the end connector panels 27 and 28 on the front of the system frames 11 and 13 face the brackets 65 as shown in top view of FIG. 6 and bracket level detail in FIG. 7. These book package end connector panels 27 and 28 have twelve sockets 27a and 28a and the cable organizer bracket includes cable grouper plugs 70 fixedly located in the bracket 65 and aligned such as to match that of the book connector sockets 27a and 28a when the cable frame 60 is connected to the system frames 11 and 13. FIG. 8 illustrates a rear view of the cable bracket detail in FIG. 7. Cable connector organizer bracket supports the cable grouper plugs at each book connector socket location for each of the book package packages. The cable organizer frame 60 holds not only the cable grouper plugs 70 in the correct position, it also holds the cabling connected thereto and the cabling to the appropriate position whether it be cabling within the same frame as illustrated in FIG. 1 with cable 50 or across frames as illustrated by cable 52. FIG. 6 is the top plan view of the cable organizer frame mounted adjacent to the frames 11 and 13. As shown in the FIG. 9 the cable frame 60 could be of two parts as shown hinged in the middle at point 81 and folded after being disconnected. As shown in FIG. 10 there may be around the periphery of the cable frame 60 alignment pins 85 and funnel shaped sockets 86 in the frames to guide the cable frame 60 into alignment with the system frames 11 and 13. Further as shown in FIG. 11 the end connector panels 27 or 28 may have alignment pins 87 and a threaded nut 27b therebetween to receive the grouper plug 70 with alignment sockets to mate with the pins 87 and a central screw 70a to match and tie down the plug 70 via the nut into the connector socket 27a.

Figure 12:
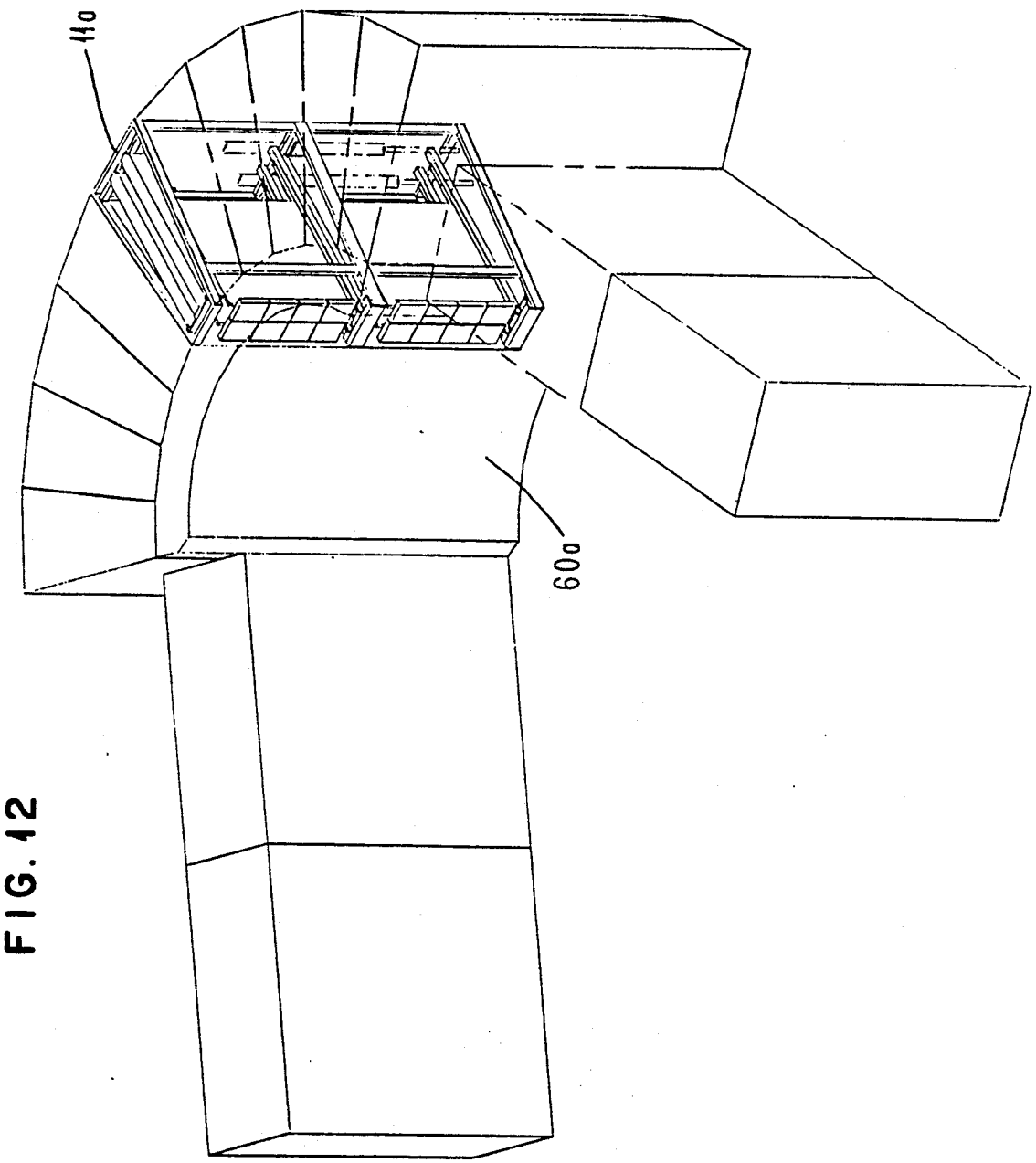
FIG. 12 is a computer system with frames placed on a semi-circle and the common interconnecting cable frame.

In another embodiment the cable frame 60 could be a large printed circuit board with appropriately matched plugs attached thereto for mounting on frames 11 and 13. Also alternatively the frames could be V-shaped and arranged in a semi-circle as shown for frames 11a in FIG. 12 with a U-shaped cable assembly frame 60a connecting all of the frames in the semi-circle.

We claim:

1. A connector system for a computer system comprising:
    plural self-standing system frames joined side by side to each other with each system frame having multiple first connectors generally coplanar and facing a same given one face of said system frames;
    a separate cable organizer frame having second connectors and cables between said second connectors fixedly mounted to and supported and housed by said cable frame with said second connectors at each end of said cables facing a given one face of said cable frame and facing said given one face of said system frames when joined to said system frames, said second connectors being arranged to align with the first connectors on said system frames when said given one face of the system frames is joined with said given one face of said cable frame, said cables and said second connectors being further arranged for interconnecting between selected said first connectors within a given system frame and selected said first connectors in a different frame of said system frames when said system frames are joined to said cable frame; and
    means for aligning and joining said cable frame to said system frames at said given one faces to provide simultaneous cable connection of said system frames and said cable frame at said first and second connectors.

2. The combination of claim 1 wherein each of said self-standing system frames includes bookcase-like structure with vertical members and shelf cross members with book-like packages slidably mounted between the shelf cross members, each of said packages includes a connector panel at one end of the respective packages holding a grouping of said first connectors and wherein said cable frame includes cable grouper plugs with each grouper plug holding a grouping of said second connectors, said grouper plugs being aligned with said connector panels when said cable frame is aligned with said self-standing system frames.

3. The combination of claim 2 wherein said system frames are joined and a semicircle in said cable frame is U-shaped.

4. The combination of claim 1 wherein said cable frame can be folded.

5. THe combination of claim 3 wherein said cable grouper plugs mate with connector sockets on the system frame's connector panels when said cable frame is joined to said system frames.

6. The combination of claim 2 wherein said grouper plugs and said connector panels have alignment means and mounting means for aligning and mating the connections.

7. The combination of claim 1 wherein said cable organizer frame is self-standing.

8. A computer system with high density circuitry modules comprising:

a plurality of self-standing system frames joined side by side where each system frame of said system frames includes vertical members and cross members forming shelves and book packages, each book package of said book packages includes support board means and interconnection circuitry on said support board means, the computer system's high density circuitry modules mounted on said support board means and coupled to said interconnection circuitry and a panel of first connectors of one connector type at one end of the support board means, said support board means being slidably mounted to and between the shelves, said high density circuitry modules being coupled via said interconnection circuitry to said panel of first connectors, the panels of first connectors when slidably mounted being aligned along a same one given face of said system frames;

a separate cable frame having second connectors of a second connector type to mate with said one connector type mounted thereon aligned in a given plane along a given face of said cable frame in prescribed locations to complement the panels of first connectors on the system frames and having cabling connected between said second connectors to provide when said cable frame is joined with said system frames panel to panel connectors of said first connectors between said system frames; and means for aligning and joining said cable frame with said system frames to provide simultaneous connection and cabling between said panels of first connectors between system frames.

9. The combination of claim 8 wherein said cable organizer frame is self-standing.

10. The combination of claim 9 wherein said cable frame is foldable.

* * * * *